United States Patent
Barth, Jr. et al.

(12)

(10) Patent No.: US 6,577,548 B1
(45) Date of Patent: Jun. 10, 2003

(54) SELF TIMING INTERLOCK CIRCUIT FOR EMBEDDED DRAM

(75) Inventors: John E. Barth, Jr., Williston, VT (US); Jeffrey H. Dreibelbis, Williston, VT (US); Erik A. Nelson, Waterbury, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/065,223

(22) Filed: Sep. 26, 2002

(51) Int. Cl.[7] .................................................. G11C 7/02
(52) U.S. Cl. ................... 365/210; 365/149; 365/230.03
(58) Field of Search ............................... 365/210, 149, 365/230.03, 189.07

(56) References Cited

U.S. PATENT DOCUMENTS

| | | | |
|---|---|---|---|
| 5,379,379 A | 1/1995 | Becker et al. ............... | 395/250 |
| 5,574,698 A | 11/1996 | Raad ...................... | 365/230.06 |
| 5,592,428 A | * 1/1997 | Harrand et al. ............. | 365/149 |
| 5,652,728 A | * 7/1997 | Hosotani et al. ............ | 365/210 |
| 5,724,295 A | 3/1998 | Beiley et al. ............... | 365/222 |

* cited by examiner

Primary Examiner—Huan Hoang
(74) Attorney, Agent, or Firm—Schmeiser, Olsen & Watts; Robert A. Walsh

(57) ABSTRACT

A method and circuit for a self timed DRAM. The circuit includes interlock circuits coupled to an extension of the DRAM. The extension does not store "real" data but mimics the operations of the DRAM. The interlock circuits, in conjunction with the extension monitor and control read and write timings of the DRAM and self adjust these timings via feedback. To properly track DRAM cell timings, the interlock circuits and extension use the same cell design and load conditions as the DRAM. The method includes: activating a wordline and reference wordline, interlocking the sense amplifiers, column select and write back functions of the primary DRAM array by monitoring the identical reference cells and the state of the bitline in the extension DRAM array.

20 Claims, 9 Drawing Sheets

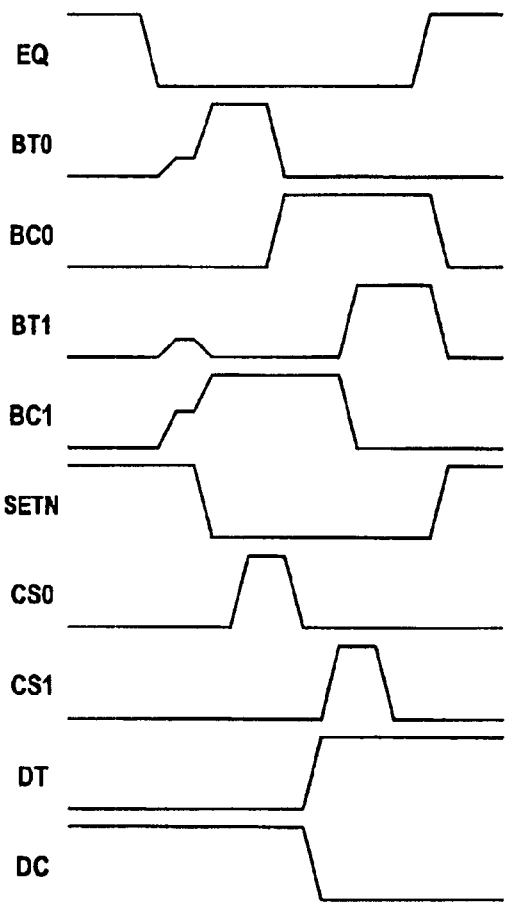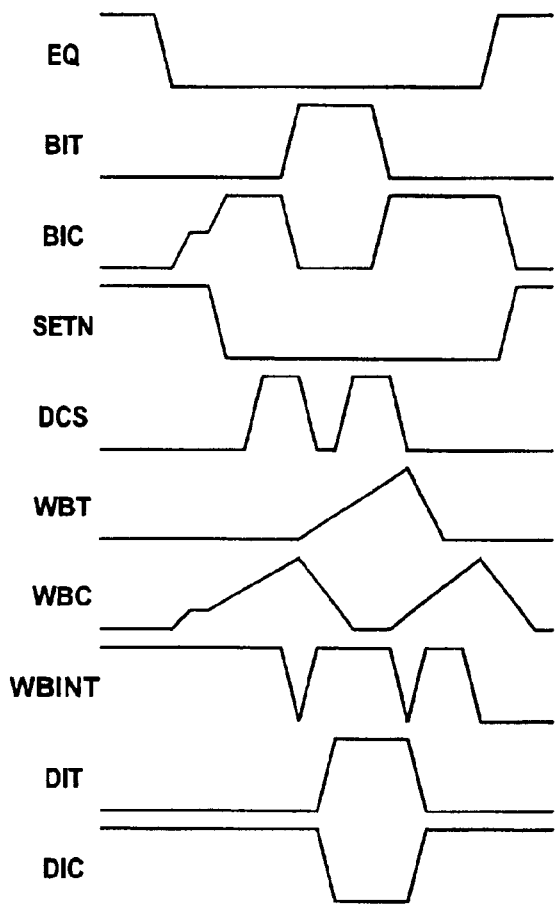
*FIG. 9A*  *FIG. 9B*

SELF TIMING INTERLOCK CIRCUIT FOR EMBEDDED DRAM

BACKGROUND OF THE INVENTION

1. Field of the Invention

The present invention relates to the field of integrated circuits; more specifically, it relates to a self timing interlock circuit for controlling read, write and page mode write functions of an embedded dynamic random access memory (DRAM).

2. Background of the Invention

The integration of embedded DRAM into specific integrated circuit (ASIC) designs has intensified the focus on architecture, design and test of high performance, high density DRAM in an ASIC environment. The ASIC environment itself presents many difficult challenges that DRAM timings are sensitive to such as noise and voltage and temperature variations as well as fabrication induced device parametric variations. These challenges can only be solved by a robust embedded DRAM architecture that is noise tolerant and can operate at high voltage for performance and low voltage for reduced power consumption.

Additionally, for test throughput, it is desirable that embedded DRAMs be tested with timings that may be optimized for logic circuits but not for DRAMs, making it difficult to identify marginal DRAM cells without unnecessarily impacting yield and thus cost.

Therefore, there is a need in the industry for improved embedded DRAM designs wherein the DRAM timing is less sensitive to noise and voltage, temperature variations.

SUMMARY OF THE INVENTION

A first aspect of the present invention is an embedded DRAM comprising: a primary DRAM array comprising: a data cell coupled to a first bitline and coupled to a wordline; a reference cell coupled to the first bitline and coupled to a reference wordline; a first bitline restore circuit coupled to the first bitline and responsive to a first control signal; a first sense amplifier coupled to the first bitline and responsive to a second control signal; and a first column select device for gating writing and reading of the first bitline, the first column select device coupled to the first bitline and responsive to a third control signal; and an extension DRAM array comprising: a dummy cell coupled to a second bitline; a first detector cell coupled to the second bitline and coupled to the reference wordline; a signal development interlock circuit for monitoring the state of the first detector cell and interlocking the second control signal in order to delay the setting of the first sense amplifier until the data cell charges the first bitline; a second detector cell coupled to the second bitline; a write back interlock circuit for monitoring the state of the second detector cell and for delaying turning off the wordline until the data cell is charged; a second bitline restore circuit coupled to the second bitline and responsive to the first control signal; a second sense amplifier coupled to the second bitline and responsive to the second control signal; a sense amplifier interlock circuit for monitoring the state of the second bitline and for delaying the third control signal until the first sense amplifier has stabilized; and a second column select device for gating coupling of the second bitline to a dummy load, the second column select device coupled to the second bitline and responsive to the third control signal.

A second aspect of the present invention is a circuit comprising: a primary DRAM array comprising a data cell coupled to a first bitline and coupled to a wordline, a reference cell coupled to the first bitline and coupled to a reference wordline, a first bitline restore circuit coupled to the first bitline and responsive to a first control signal, a first sense amplifier coupled to the first bitline and responsive to a second control signal and a first column select device for gating data write and read of the first bitline, the first column select device coupled to the first bitline and responsive to a third control signal; an extension DRAM array comprising a dummy cell coupled to a second bitline, a first detector cell coupled to the second bitline and coupled to the reference wordline, the first detector cell generating a signal development control signal, a second detector cell coupled to the second bitline, the second detector cell generating a write back control signal, a second bitline restore circuit coupled to the second bitline and responsive to the first control signal, a second sense amplifier coupled to the second bitline and responsive to the second control signal and a second column select device for gating coupling of the second bitline to a dummy load, the second column select device coupled to the second bitline and responsive to the third control signal; a signal development interlock circuit for generating the second control signal, the signal development interlock circuit coupled to the first detector cell and receiving the signal development control signal; a sense amplifier interlock circuit for generating the third control signal, the sense amplifier interlock circuit coupled to the first control signal and the second bitline; and a write back interlock circuit for controlling turn off of the wordline, the write back interlock circuit coupled to the second detector cell and receiving the write back control signal.

A third aspect of the present invention is a method for self timing a DRAM circuit comprising: providing a primary-DRAM array, the primary DRAM comprising a data cell coupled to a first bitline and coupled to a wordline, a reference cell coupled to the first bitline and coupled to a reference wordline, a first bitline restore circuit coupled to the first bitline and responsive to a first control signal, a first sense amplifier coupled to the first bitline and responsive to a second control signal and a first column select device coupled to the first bitline and responsive to a third control signal, the first column select device gating data write and read of the first bitline; providing an extension DRAM array, the extension array comprising a dummy cell coupled to a second bitline, a first detector cell coupled to the second bitline and coupled to the reference wordline, the first detector cell generating a signal development control signal, a second detector cell coupled to the second bitline, the second detector cell generating a write back control signal, a second bitline restore circuit coupled to the second bitline and responsive to the first control signal, a second sense amplifier coupled to the second bitline and responsive to the second control signal and a second column select device coupled to the second bitline and responsive to the third control signal, the second column select device gating coupling of the second bitline to a dummy load; providing a signal development interlock circuit, the signal development interlock circuit coupled to the first detector cell and receiving the signal development control signal and generating the second control signal; providing a sense amplifier interlock circuit, the sense amplifier interlock circuit coupled to the first control signal and the second bitline and generating the third control signal; and providing a write back interlock circuit, the write back interlock circuit coupled to the second detector cell and receiving the write back control signal and controlling turn off of the wordline.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 9A and 9B are timing diagrams of various signals in the array and array extension during page mode according to the present invention.

DETAILED DESCRIPTION OF THE INVENTION

The present invention utilizes interlock circuits coupled to an extension of the DRAM. The extension does not store "real" data but mimics the operations of the DRAM. The interlock circuits, in conjunction with the extension monitor and control read and write timings of the DRAM and self adjust these timings via feedback. To properly track DRAM cell timings, the interlock circuits and extension use the same cell design and load conditions as the DRAM. Due to the geometries and effect of lithographic processes used during fabrication of the DRAM, the data cells, reference cells and sense amplifiers used by both the DRAM and the extension are identical and the extension cells and sense amps are laid out immediately adjacent to the DRAM. However, the extension and DRAM may be separated by dummy sense amplifiers and cells (not illustrated in the present invention) commonly used at array edges or around wordline stitching. Further, reference cells, data cells and sense amplifier transistors. of both the DRAM and the extension share the same P-well (the DRAM cell of the present invention utilizes an NFET transistor as described infra.)

The term and symbol VDD indicates the logic high voltage and logic and array signals swing between VDD and ground unless otherwise noted. The term and symbol VPP indicates wordline high voltage and in one example has a value equal to the twice the value of VDD. The term and symbol VREFX indicates reference wordline high voltage, which, in one example, has a value of one half of the value of VDD. The term storage capacitor may be read as storage node, since the present invention is not necessarily limited to capacitive storage devices.

Figure 1:
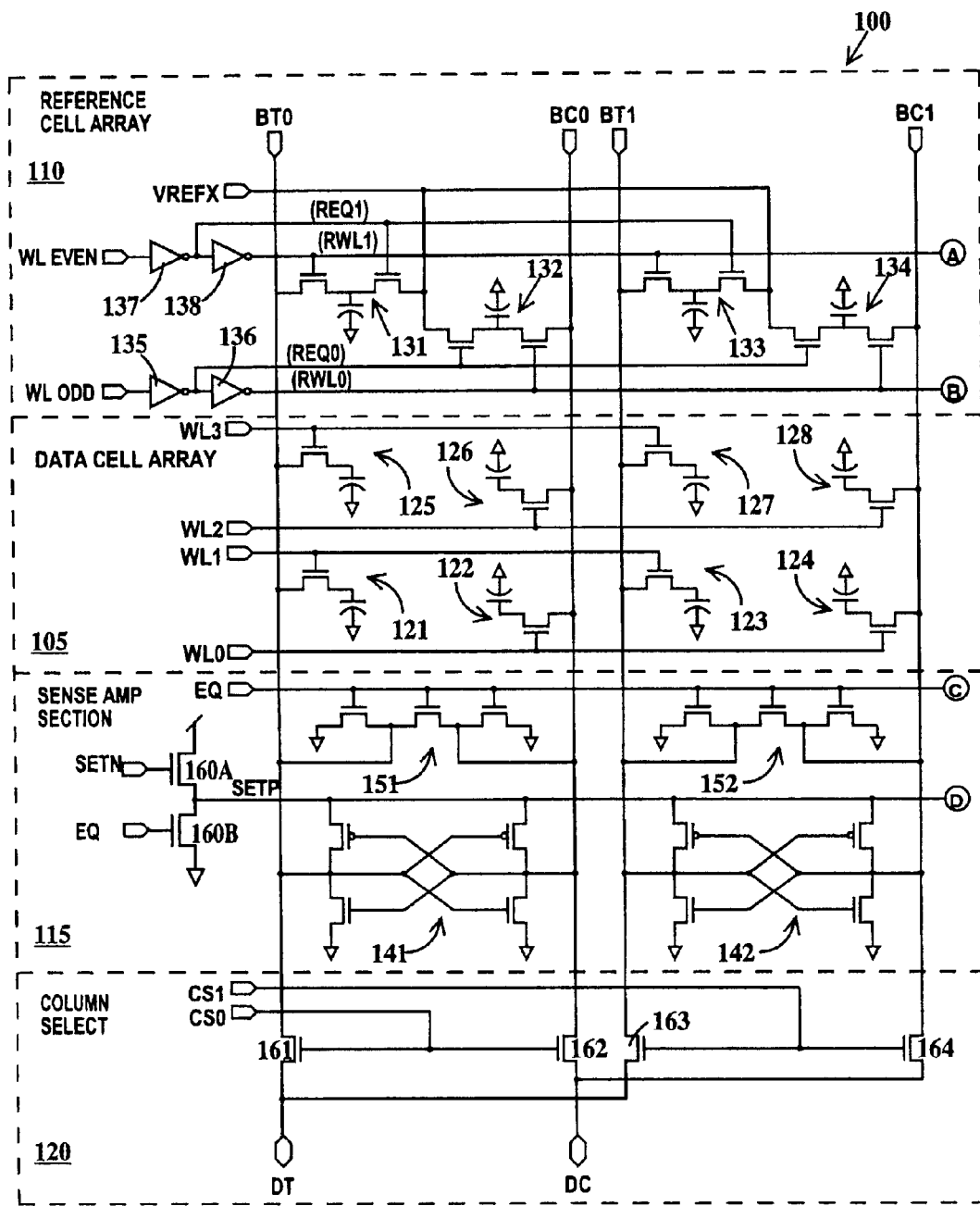
FIG. 1 is schematic circuit diagram of an embedded primary DRAM array 100 according to the present invention.

Referring to the drawings, FIG. 1 is schematic circuit diagram of an embedded primary DRAM array 100 according to the present invention. In FIG. 1, primary DRAM array 100 includes a data cell array 105, a reference cell array 110, a sense amplifier section 115 and column select circuits 120. Primary DRAM array 100 is a GND restore DRAM, i.e. the bitlines are initialized from GND. For simplicity, primary DRAM 100 includes only four wordlines WL0, WL1, WL2 and WL3 and two bitline pairs BT0 and BC0 (true and complement of bitline 0) and BT1 and BC1 (true and complement of bitline 1). In practice, the number of wordlines and bitlines may be any number.

Data cell array 105 includes a first data cell 121 coupled between WL1 and BT0, a second data cell 122 coupled between WL0 and BC0, a third data cell 123 coupled between WL1 and BT1, a fourth data cell 124 coupled between WL0 and BC1, a fifth data cell 125 coupled between WL3 and BT0, a sixth data cell 126 coupled between WL2 and BC0, a seventh data cell 127 coupled between WL3 and BT1 and an eighth data cell 128 coupled between WL2 and BC1. Each data cell 121 through 128 includes an NFET and a storage capacitor. The first source/drain of each NFET is coupled to that data cells respective bitline and the second source/drain of the NFET to a first plate of the capacitor. The second plate of each storage capacitor is coupled to ground and the gate of each NFET is coupled to that data cells respective wordline.

Reference cell array includes a first reference cell 131, a second reference cell 132, a third reference cell 133 and a fourth reference cell 134. The number of reference cells is equal to the number of bitlines in primary DRAM array 100. Reference cells 131 through 134 each include a first NFET, a second NFET and a storage capacitor.

For each reference cell 131 through 134, the first source drain of each NFET and the first plate of the storage capacitor share a common node and the second plate of the storage capacitor is coupled to ground.

For second reference cell 132, the second source/drain of the first NFET is coupled to BC0 and the gate of the first NFET is coupled to a first reference wordline (RWL0). The second source/drain of the second NFET is coupled to VREFX and the gate of the second NFET is coupled to a first reference equalize signal line (REQ0).

For first reference cell 131, the second source/drain of the first NFET is coupled to BT0 and the gate of the first NFET is coupled to a second reference wordline (RWL1). The second source/drain of the second NFET is coupled to VREFX and the gate of the second NFET is coupled to a second reference equalize signal line (REQ1).

For fourth reference cell 134, the second source/drain of the first NFET is coupled to BC1 and the gate of the first NFET is coupled to RWL0. The second source/drain of the second NFET is coupled to VREFX and the gate of the second NFET is coupled to REQO.

For third reference cell 133, the second source/drain of the first NFET is coupled to BT1 and the gate of the first NFET is coupled to RWL1. The second source/drain of the second NFET is coupled to VREFX and the gate of the second NFET is coupled to REQ1.

Reference cells charge the bitline of each bitline pair that is not being activity written to or read out. For example, if BT0 is being read, then BC0 will be charged (oppositely) from BT0 by reference cell 132.

The signal on REQ0 is generated by inversion of a WL ODD signal by inverter 135. The signal on RWL0 is generated by inversion of the inverted WL ODD signal by inverter 136. The signal on REQ1 is generated by inversion of the a WL EVEN signal by inverter 137. The RWL1 signal is generated by inversion the inverted WL EVEN signal by inverter 138. WL ODD is active when any odd numbered wordline is active, in this example WL1 or WL3. WL EVEN is active when any even numbered wordline is active, in this example WL0 or WL2. There are only two reference wordlines, RWL1 representing odd numbered wordlines in data cell array 105 and RWL0 representing even numbered wordlines in data cell array 105.

Sense amplifier section 115 includes a first sense primary amplifier 141, a second sense primary amplifier 142, a first primary bitline restore circuit 151 and second primary bitline restore circuit 152. The number of primary sense amplifiers and primary bitline restore circuits is equal to the number bitline pairs in primary DRAM array 100.

In the present example, sense primary amplifiers 141 and 142 are common cross-coupled amplifiers. Each primary sense amplifier 141 and 142 includes two PFET/NFET stacks, each PFET/NFET stack having a common node (where the drain of the NFET couples to the drain of the PFET). The gates of the NFET and the PFET of the each stack are coupled to each other and cross-coupled to the common node of the other stack.

For both first primary sense amplifier 141 and second primary sense amplifier 142, the sources of the PFETS are coupled to a sense amplifier enable line (SETP) and the source of the NFETS are coupled to ground. For first primary sense amplifier 141, the common node of the first NFET/PFET stack is coupled to BT0 and the common node of the second NFET/PFET stack is coupled to BC0. For second primary sense amplifier 142, the common node of the first NFET/PFET stack is coupled to BT1 and the common node of the second NFET/PFET stack is coupled to BC1.

The signal on SETP is generated by an transistors 160A and 160B in response to a sense amplifier enable signal (SETN) low which will bring SETP high or an equalize signal (EQ) high which will bring SETP low. With SETP low, there is no amplification of the signals on any of the bitlines. SETN and EQ are shared by primary DRAM array 100 and extension DRAM array 200 (see FIG, 2).

First and second primary restore circuits 151 and 152 each include three NFETs in series, the gates of each NFET coupled to a signal line carrying EQ. For each primary restore circuit 151 and 152, the source of the first NFET and source of the third NFET are coupled to ground. For first primary restore circuit 151, a first source/drain of the second NFET is coupled to the drain of the first NFET and to BT0. A second source/drain of the second NFET is coupled to the drain of the third NFET and to BC0. For second primary restore circuit 152, a first source/drain of the second NFET is coupled to the drain of the first NFET and to BT1. A second source/drain of the NFET is coupled to the drain of the third NFET and to BC1. When EQ is low bitlines BT0, BC0, BT1 and BC1 are pulled low, and the second NFET pulls the true and compliment of each bit equally low.

Column select circuits 120 are comprised of a one NFET for each bitline, each NFET acting to gate the output of that bitline. In the present example, there are four NFETs 161, 162, 163 and 164. A first source/drain of NFET 161 is coupled to BT0 and a second source/drain of NFET 161 is coupled to an input/output node, data true (DT), of primary DRAM array 100. A first source/drain of NFET 162 is coupled to BC0 and a second source/drain of NFET 162 is coupled to an input/output node, data compliment (DC), of primary DRAM array 100. The gates of NFETS 161 and 162 are coupled to a column select zero signal line (CS0). A first source/drain of NFET 163 is coupled to BT1 and a second source/drain of NFET 163 is coupled to DT. A first source/drain of NFET 164 is coupled to BC1 and a second source/drain of NFET 164 is coupled to DC. The gates of NFETS 163 and 164 are coupled to a column select zero signal line (CS1). There is one column select line for each bitline pair in primary DRAM array 100. Thus, NFETs 161, 162, 163 and 164 act as bit switches, gating input and output through nodes DT and DC.

A DRAM is written or read by bringing a selected wordline high to move the charge stored in all cells coupled to that wordline to the bitlines. The sense amplifiers amplify this small amount of charge and the column select connect the amplified signal to read/write data paths devices corresponding to the activated column select devices. The restore circuits, recharge the bitlines after the sense amplifiers are turned off.

The timings to be interlocked in primary DRAM array 100 are the following: first, the sense amplifier turn on must be delayed long enough to get the charge from the data cell to its respective bitline; second, the column decode must be delayed until the sense amplifiers stabilize and third, turning of the wordlines off after write back and initiating restore with EQ must be delayed until the storage capacitor is fully charged. There is an interlock circuit for each of the functions that will be discussed in turn infra. The signal that these interlock circuits utilize are generated by an array extension coupled to DRAM array 100 at points A (RWL1), B (RWL0), C (EQ) and D (SETP) as illustrated in FIG. 2 and described infra.

Figure 2:
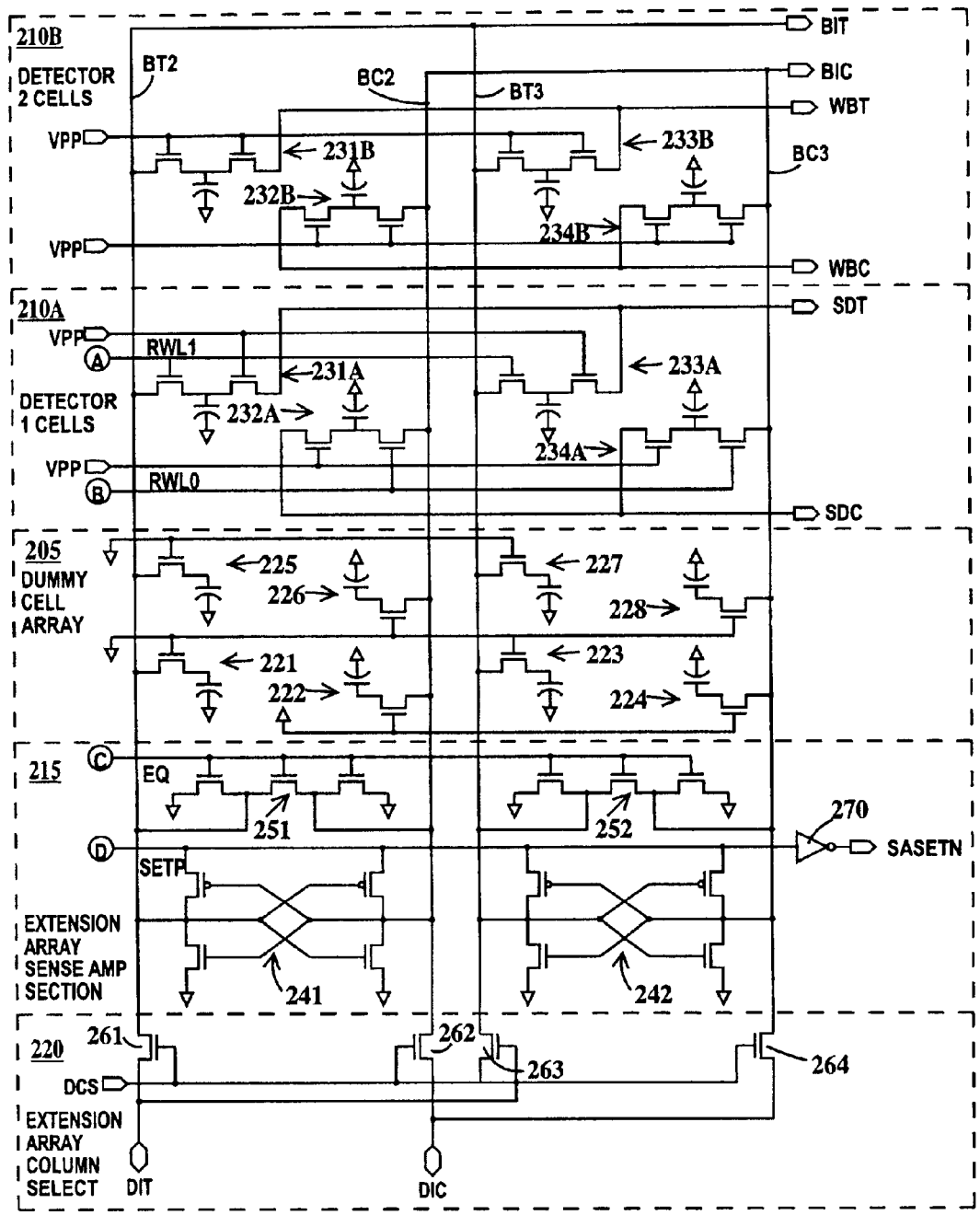
FIG. 2 is schematic circuit diagram of an extension DRAM array 200 according to the present invention.

FIG. 2 is schematic circuit diagram of an extension DRAM array 200 according to the present invention. In FIG. 2, extension DRAM array 200 includes a dummy cell array 205, a first detector cell array 210A, a second detector cell array 210B, an extension array sense amplifier section 215 and extension array column select circuits 220. Extension DRAM array 200 includes only two bitline pairs, BT2/BC2 and BT3/BC3 (no matter how may bitline pairs are included in primary DRAM 100 of FIG. 1). BT2 BT3 are coupled to produce a bitline interlock true output (BIT) and BC2 and BC3 are coupled to produce a bitline interlock complement output (BIC). Extension DRAM array 200 is a GND restore DRAM.

Dummy cell array 205 includes eight dummy cells 221, 222, 223, 224, 225, 226, 227 and 228. There are two dummy cells (one dummy cell for each bitline pair) for each wordline in primary DRAM array 100 (see FIG. 1). Since there were only four wordlines illustrated in FIG. 1, and there are only two bitline pairs in FIG. 2, eight dummy cells are illustrated in FIG. 2. Dummy cells 221, 222, 223, 224, 225, 226, 227 and 228 are identical, respectively, to data cells 121, 122, 123, 124, 125, 126, 127 and 128 except all the gates of the NFETs of each dummy cell are tied to ground and BT2, BT3, BC2 and BC3 replace BT0, BT1, BC0 and BC1 respectively. Dummy cells 221, 222, 223, 224, 225, 226, 227 and 228 place the same capacitive load on BT2, BT3, BC2 and BC3 as data cells 121, 122, 123, 124, 125, 126, 127 and 128 place on BT0, BT1, BC0 and BC1, which is important since load translates into delay.

First detector cell array 210A includes four detector cells 231A, 232A, 233A and 234A. There is one detector cell for each bitline. Detector cells 231A, 232A, 233A and 234A are identical to reference cells 131, 132, 133 and 134 of FIG. 1, except the gate the second NFET is coupled to VPP (instead of REQ), the second source/drain of the second NFET is coupled to a signal development true (SDT) output for detector cells 231A and 233A, the second source/drain of the second NFET is coupled to a signal development compliment (SDC) output for detector cells 232A and 234A and BT2, BT3, BC2 and BC3 replace BT0, BT1, BC0 and BC1 respectively.

Detector cells 231A, 232A, 233A and 234A are precharged to VDD. Two detector cells (one for each bitline pair) are discharged when a reference wordline line is fired generating the SDT and SDC signals. The SDT and SDC signals are used by the signal interlock circuit illustrated in FIG. 3 and described infra.

Second detector cell array 210B includes four detector cells 231B, 232B, 233B and 234B. There is one detector cell for each bitline. Detector cells 231B, 232B, 233B and 234B are identical to reference cells 131, 132, 133 and 134 of FIG. 1, except the gates the first and second NFETs are coupled to VPP (instead of REQ, RWL0 or RWL1), the second source/drain of the second NFET is coupled to a write back true (WBT) output for detector cells 231B and 233B, the second source/drain of the second NFET is coupled to a write back compliment (WBC) output for detector cells 232B and 234B and BT2, BT3, BC2 and BC3 replace BT0, BT1, BC0 and BC1 respectively.

Detector cells 231B, 232B, 233B and 234B are precharged to GND, and WBT and WBC are low. When sense amplifier 241 or sense amplifier 242 sets, WBT or WBC will go high, with the same time constant as a write to a real cell. The WBT and WBC signals (as well as the BIT and BIC signals) are used by the write back interlock circuit illustrated in FIG. 5 and described infra.

Extension array sense amplifier section 215 includes first extension sense amplifier 241, second extension sense amplifier 242, a first extension bitline restore circuit 251 and extension second bitline restore circuit 252. There are only two extension sense amplifiers and two extension bitline restore circuits, one for each bitline pair in extension DRAM array 200. Extension sense amplifiers 241 and 242 and extension restore circuits 251 and 252 are identical to primary sense amplifiers 141 and 142 and primary restore circuits 151 and 152 of FIG. 1 except BT2, BT3, BC2 and BC3 replace BT0, BT1, BC0 and BC1 respectively. The SETP signal is inverted by inverter 270 to a generate sense amplifier set enable detect (SASETN) signal. The SASETN signal (as well as the BIT and BIC signals) is used by the sense amplifier interlock circuit illustrated in FIG. 4 and described infra.

Extension array column select circuits 220 are comprised of a one NFET for each bitline, each NFET acting to gate the output of that bitline. A first source/drain of NFET 261 is coupled to BT2 and a second source/drain of NFET 261 is coupled to a data interlock true (DIT) input/output of extension DRAM array 200. A first source/drain of NFET 262 is coupled to BC2 and a second source/drain of NFET 262 is coupled to a data interlock compliment (DIC) input/output of extension DRAM array 200. DIT and DIC are coupled to a dummy load. A first source/drain of NFET 263 is coupled to BT3 and a second source/drain of NFET 263 is coupled to DIT. A first source/drain of NFET 264 is coupled to BC3 and a second source/drain of NFET 264 is coupled to DIC. The gates of NFETS 261, 262, 263 and 264 are coupled to a dummy column select signal line (DCS). DCS is discussed infra in reference to FIG. 5.

Figure 3:
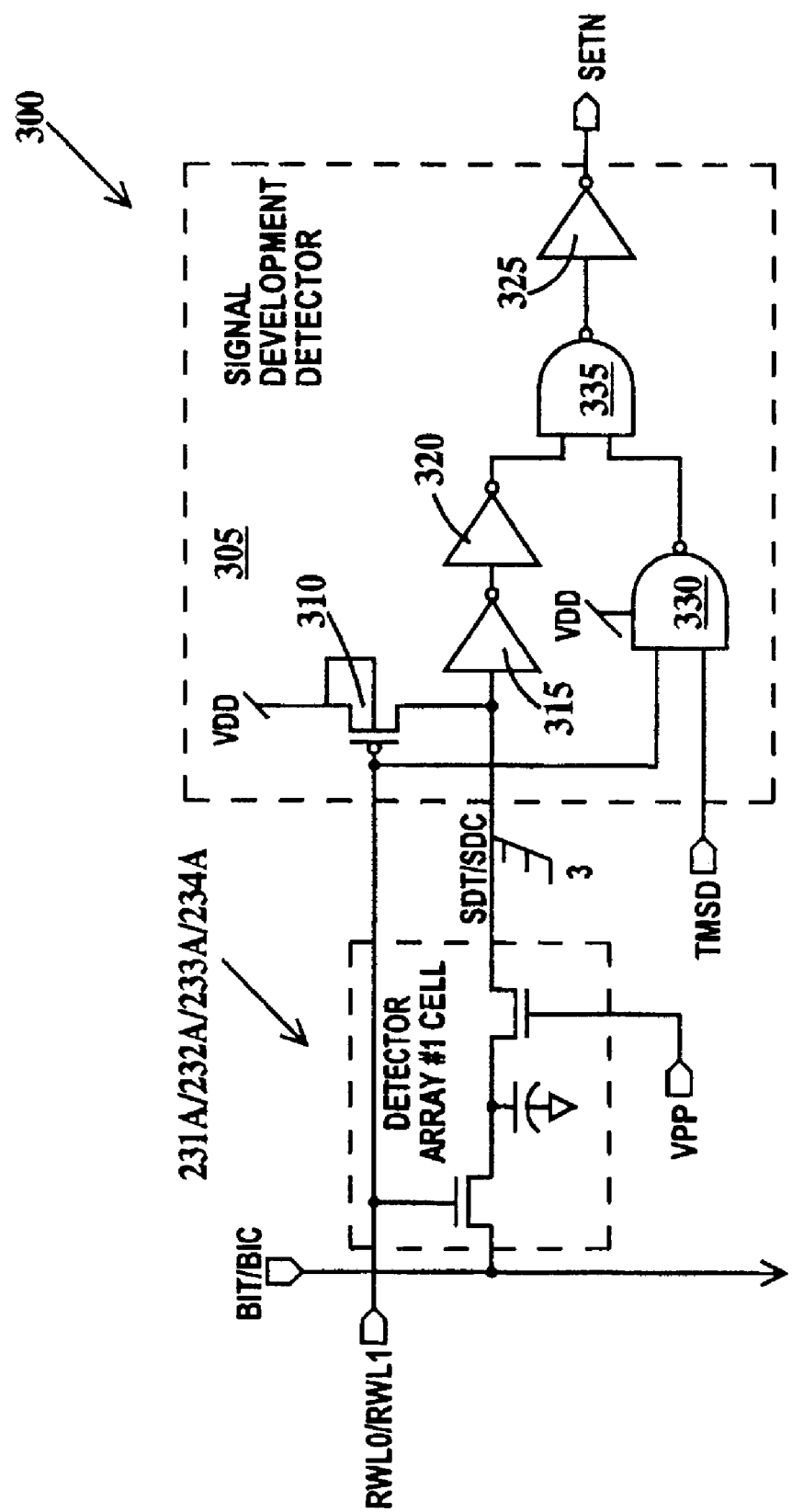
FIG. 3 is schematic diagram of a signal development interlock circuit 300 according to the present invention.

FIG. 3 is schematic diagram of a signal development interlock circuit 300 according to the present invention. The signal development interlock delays the sense amplifier set signal long enough to get the charge from the data cell to its respective bitline. In FIG. 3, signal development interlock circuit 300 includes four signal interlock detectors 305 and detector cells 231A, 232A, 233A and 234A of first detector cell array 210A (see FIG. 2). Only one detector-1 cell and one signal interlock detector 305 are illustrated in FIG. 3, however it will be understood that two of the four interlock detectors are coupled to detector cells 231A and 233A via RWL1 and the other two interlock detectors 305 are coupled to a detector cells 232A and 234A via RWL0 of first detector cell array 210A (see FIG. 2).

Signal development detector 305 includes a PFET 310 coupled to the corresponding reference word line RWL0 or RWL1 as described supra, inverters 315, 320, and 325, and NAND gates 330 and 335. If the gate of PFET 310 is coupled to RWL0, then the input of inverter 315 and the drain of PFET 310 are coupled to SDC. If the gate of PFET 310 is coupled to RWL1, then the input of inverter 315 and the drain of PFET 310 are coupled to SDT. The source of PFET 310 is coupled to VDD. The output of inverter 315 is coupled to the input of inverter 320 and the output of inverter 320 is coupled to a first input of NAND gate 335. The gate of PFET 310 is coupled to a first input of NAND gate 330 and the output of NAND gate 330 is coupled to the second input of NAND gate 335. The output of NAND gate 335 is coupled to the input of inverter 325. The output of inverter 325 is the SETN signal mentioned supra in reference to FIG. 1. It is through SETN that signal development detector 305 controls the timing of primary sense amplifiers (141 and 142) of primary DRAM array 100 (see FIG. 1) and etesnsion sense amplifiers (241 and 242) of extension DRAM array 200 (see FIG. 2). A test mode signal detector (TMSD) signal is coupled to a second input of first NAND gate 330 for testing. Timing is primarily controlled by the delay through inverters 315 and 320.

Whenever a reference word line fires, the detector cells on that reference wordline discharge, turning on PFET 305 and generating a delayed positive SETN signal. When SETN is positive the sense amplifiers amplify the signals on the bitlines of primary DRAM array 100 (see FIG. 1).

Due to the high capacitance of DRAM cells (in one example, about 40 ff), the gate load of signal development detector 305 (in one example, about 1 ff) is negligible. The load effect of signal development detector 305 is also reduced by the operation of two detector cells in parallel, i.e. detector cells 231A and 233A or detector cells 232A and 234A. TSMD may be used to move the trip point of development detector 305 for margin testing. Further test mode signals, not illustrated may be used to select near or far end development detectors 305 for further margin testing. Near and far end are discussed infra in reference to FIG. 10. At this point, it is sufficient to be aware of the fact, that in one embodiment of the present invention, there are two extension DRAM arrays 200 (see FIGS. 2 and 10) and sets of interlock circuits located on opposite sides of the primary DRAM array 100 (see FIGS. 1 and 10).

To ensure that extension sense amplifiers 241 and 242 (see FIG. 2) are setting to the same state, all reference wordlines are held at a wordline off level (GND). Since the signal on extension sense amplifiers 241 and 242 is provided by detector cells 231A, 232A, 233A and 234A and pre-charged to VDD (see FIG. 2), twice the voltage VREFX, provided by reference cells 131, 132, 133 and 134 of primary DRAM array 100 (see FIG. 1), that same state will be a known state. Set speed of sense amplifiers 241 and 242 (see FIG. 2) will be dictated by the speed of a set bus (SETP), so providing twice the signal will not cause extension sense amplifiers 241 and 242 to set faster.

Figure 4:
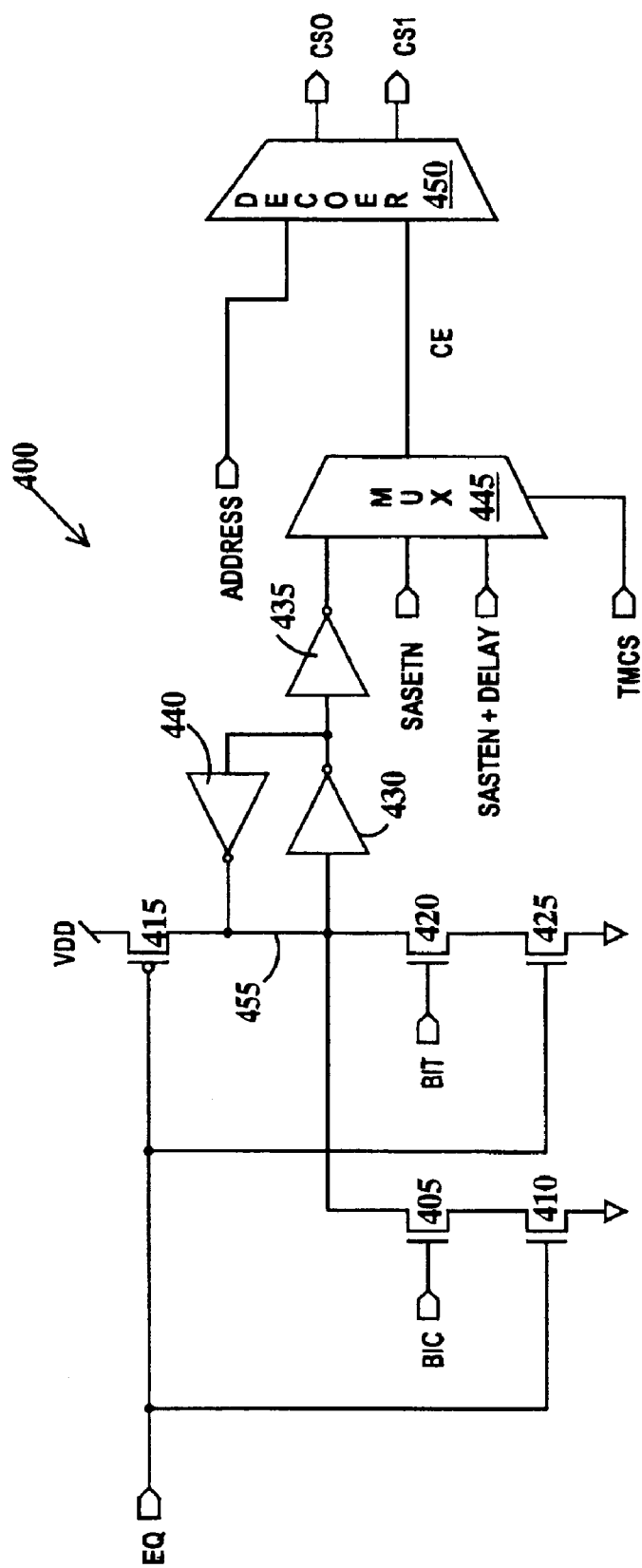
FIG. 4 is schematic diagram of a sense amplifier interlock circuit 400 according to the present invention.

FIG. 4 is schematic diagram of a sense amplifier interlock circuit 400 according to the present invention. The sense amplifier interlock delays the column decode until the primary sense amplifiers stabilize. The primary sense amplifiers are considered stabilized when the bitline signal has been amplified enough to tolerate noise on the bitline. Sense amplifier interlock circuit 400 includes NFETs 405, 410, 420 and 425, PFET 415, inverters 430, 435 and 440, multiplexers 445 and decoder 450. The drain of NFET 405 is coupled to a node 455 and the source of NFET 405 to the drain of NFET 410. The source of NFET 410 is coupled to GND. The drain of NFET 420 is coupled to node 455 and the source of NFET 420 to the drain of NFET 425. The source of NFET 425 is coupled to GND. The gates of NFETs 410 and 425 are coupled to EQ. The gate of NFET 405 is coupled to BIC and the gate of NFET 420 is coupled to BIT. The source of PFET 415 is coupled to VDD, the drain of PFET 415 is coupled to node 455 and the gate of PFET 415 to EQ. The input to inverter 430 and the output of inverter 440 are coupled to node 455. The output to inverter 430 and the input to inverter 440 is coupled to the input of inverter 435. The output of inverter 435 is coupled to a first input of multiplexer 445.

A sense amplifier set enable detect (SASETN) signal is coupled to a second input of multiplexer 445. A delayed set enable detect (SASETN+DELAY) isare coupled to a third input of multiplexer 445 respectively. SASETN, SASETN+ DELAY are timing signals that are used to shift the trigger point of sense amplifier interlock circuit 400 for margin testing, they are selected (as well as the output of inverter 435) by a test mode column select (TMCS) signal.

The output of multiplexer 445, a column enable (CE) signal, is coupled to a first input of decoder 450. An ADDRESS signal is applied to a second input of decoder 450. The ADDRESS signal determines the state of CS0 and CS1 which are used by column select circuits 120 of primary DRAM array 100 to gate input and output on nodes DT and DC (see FIG. 1). BIT and BIC set the state of the latch formed by inverter 430 and inverter 440, enabling decoder 450. EQ resets the state of the latch formed by inverter 430 and inverter 440.

In FIG. 2, bitlines BT2 (and BC2) and BT3 (and BC3) are pre-charged low. When sense amplifiers 241 and 242 are set, one of the two bitlines will go high, triggering sense amplifier interlock circuit 400 of FIG. 4.

More generally, it is important that the sense amplifiers of the extension DRAM array be identical to the sense amplifiers of the primary DRAM array, be physically located adjacent to the sense amplifiers of the primary DRAM array and be coupled to the same SETP signal as the sense amplifiers of the primary DRAM array for the best working of the invention. Due to the heavy load on bitlines (in one example, about 100 ff), the load of sense amplifier interlock is negligible (in one example, about 1 ff). Multiple bitlines in the extension array are connected in parallel to provide signal averaging and trigger reliability.

Figure 5:
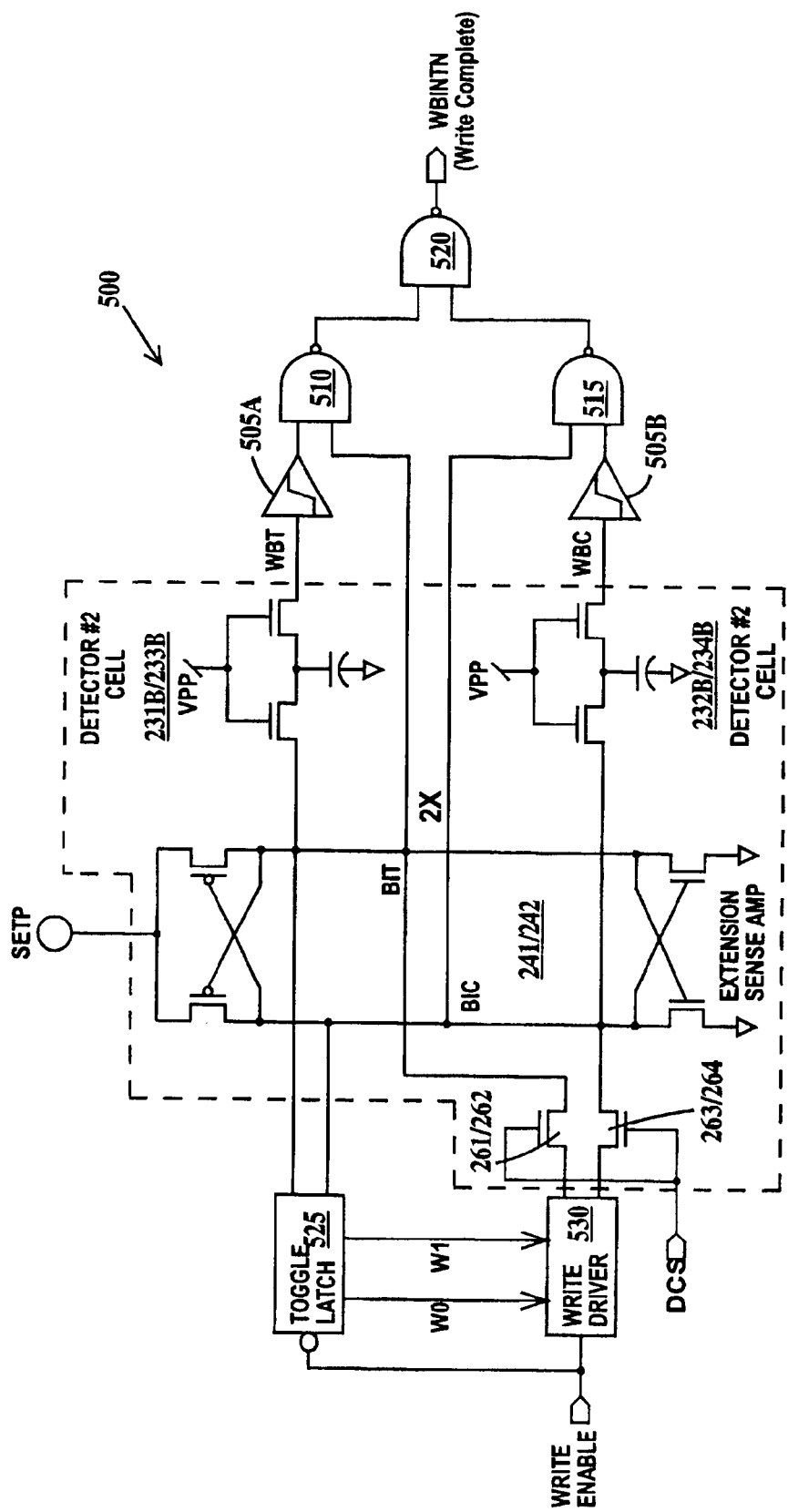
FIG. 5 is schematic diagram of a write back interlock circuit 500 according to the present invention.

FIG. 5 is schematic diagram of write back interlock circuit 500 according to the present invention. Write back interlock circuits 500 delay turning the wordlines off after write back (bitline restore) until the storage capacitor of the cells are fully charged.

Write back interlock circuit 500 supports three write back timing control functions: cell refresh, first write and late write (also known as Page Mode). Cell refresh, which begins as soon as the sense amplifiers set is distinguished from cell write which must wait for the sense amplifiers to fully set, the bit switch to open and the sense amplifier to flip before data can be written into the cell. Late write occurs when new data arrives after the sense amplifier has set and bitline precharge must be delayed until the cell is fully written.

In FIG. 5, write back interlock circuit 500 includes a first Schmitt trigger 505A and a second Schmitt trigger 505B, three NAND gates 510, 515 and 520, a toggle latch 525, a write driver 530, NFETs 261/262, NFETS 263/264, detector cells 231B and 232B (or 233B and 234B) of second detector cell array 210B and sense amplifiers 241 (or 242) of extension DRAM array 200 (see FIG. 2). A WRITE ENABLE signal is coupled to toggle latch 525 and write driver 530. WRITE ENABLE is a global chip (for the embedded DRAM) signal. Toggle latch sends 525 sends a write zero (W0) or a write one (W1) signal to write driver 530. Toggle latch 525 is coupled to BIC and BIT in order to determine which bitline was last discharged. The W0 and W1 signals in effect "toggle" whether true detector 2 cells 231B and 233B or compliment detector cells 232B and 234B are used to generate a write complete (WBINTN) signal. This is discussed more fully infra. The source/drains of NFETs 263/264, are coupled between write driver 530 and BIT and the source/drains of NFETs 261/262 are coupled between write driver 530 and BIC. The gates of NFETs 261/262 and NFETs 263/264, are coupled to DCS. DCS is generated by combining CS0 and CS1. Whenever CS0 or CS1 is DCS high. DCS is low when both CS0 and CS1 are low.

Schmitt trigger 505A is coupled between WBT and a first input of NAND gate 510 and Schmitt trigger 505B is coupled between WBC and a first input of NAND gate 515. A second input of NAND gate 510 is coupled to BIT and s second input of NAND gate 515 is coupled to BIC. The outputs of NAND gates 510 and 515 are coupled to first and second inputs, respectively, of NAND gate 520, the output of NAND gate 520 being WBINTN. Before further discussion of the operation of write back interlock circuit 500, a brief description of Schmitt triggers 505A and 505B is appropriate.

Figure 6:
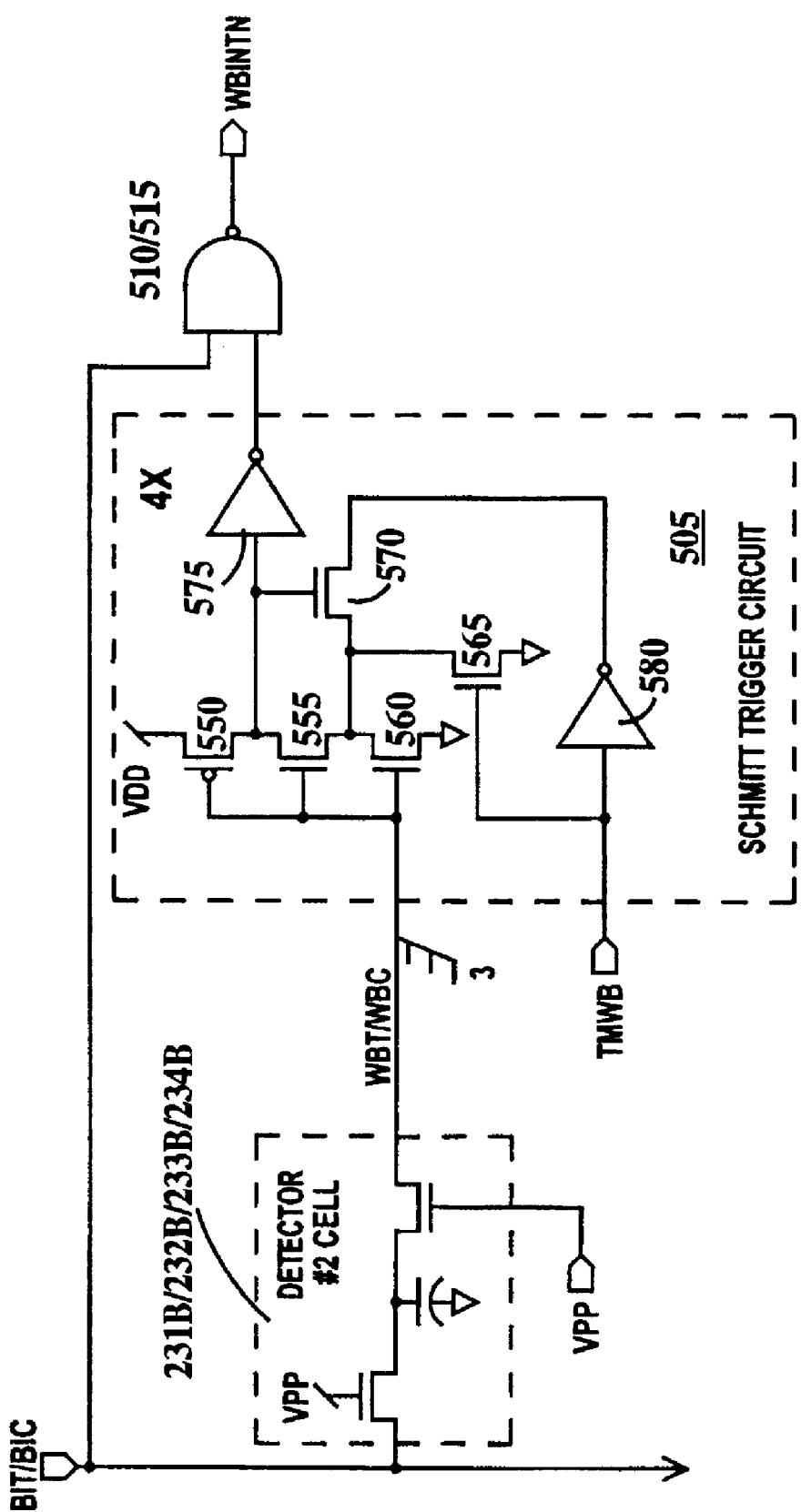
FIG. 6 is schematic diagram of a Schmitt trigger circuit 505 according to the present invention.

FIG. 6 is schematic diagram of the Schmitt trigger circuit 505 according to the present invention. Bitlines BIT and BIC, NAND gates 510 and 515 and detector 2 cells 231B, 232B, 233B and 234B are illustrated in FIG. 6 as an aid only. Schmitt trigger 505 (representing 505A and 505B of FIG. 5) includes PFET 550, 4 NFETS 555, 560, 565 and 570 and two inverters 575 and 580. There are four identical Schmitt triggers, differing in only which detector 2 cell each is coupled to. Schmitt trigger 505 is a high trip-point device.

The gates of PFET 550 and NFETs 555 and 560 are coupled to either WBT or WBC (see FIG. 5). The source of PFET 550 is coupled to VDD and the drain of PFET 550 is coupled to the drain of NFET 555, the gate of NFET 570 and the input of inverter 575. The source of NFET 555 is coupled to the drain of NFET 560, the source of NFET 570 and the drain of NFET 565. The drain of NFET 570 is coupled to the output of inverter 580. The sources of NFETs 560 and 565 are coupled to GND. A test mode write back (TMWB) signal is coupled to the gate of NFET 565 and the input of inverter 580. TMWB allows changing the trigger level of Schmitt trigger 505 to allow for margin testing. The output of inverter 575 is coupled to NAND gates 510 or 515 (see FIG. 5).

The operation of Schmitt triggers is well known in the art and will not be discussed. Suffice to say, when a bitline starts to discharge, WBINTN goes inactive (high) very quickly and does not activate until WBT/WBCreach a level very close to VDD.

Returning to FIG. 5, the storage capacitor of each detector 2 cell 231B, 232B, 233B and 234B is pre-charged to the same low as BIT/BIC. When sense amplifiers 241 and 242 set, the storage capacitor of each detector 2 cell is charged high with the same time constant as any of the cells 221, 222, 223, 224, 225, 226, 227 or 228 in cell array 105 of primary DRAM array 100 (see FIG. 1). WBT (or WBC) is monitored. Write back interlock circuit 500 is triggered when WBT (or WBC) is high enough to fire the Schmitt trigger 505. This mimics the worst-case write back of a "1."

A first write occurs after sense amplifiers 241 or 242 set when any bit-switch (NFETs 261, 262, 263 or 264 of FIG. 2) fires and new data is driven onto the sense amplifiers. The "first interlock" times cell write back to know when amplifiers 241 and 242 must be written to the opposite state. This interlock is achieved by using amplifiers 241 and 242 as toggle flip-flops. With amplifier 241 or 242 initially set to a known state, the sense amplifier is toggled to the opposite state with the same timing as of sense amplifiers 141 or 142 of primary DRAM array 100 (see FIG. 1). Sense amplifiers 241 or 242, in turn, charge the corresponding detector 2 cell 231B, 232B, 233B or 234B. The detector cell charge level and the bit-line charge level are compared (NAND gates 510 and 515) and interlock is delayed until they are the same. Schmitt trigger 505A will not enable precharge (via WBINTN) until the detector 2 cell to be written reaches full charge.

A late write occurs after sense amplifier 241 or 242 has been set, written by a "first write" and then written to a "third" state. The delay in turning wordlines off until a late write occurs is achieved by using amplifiers 241 and 242 as toggle flip-flops. The number of the page cycle is unknown so every page cycle must be treated as the last page cycle. Page mode rate can exceed the time required to write and pre-charge any single cell, therefore two cells are used and toggled at half the rate. The "first," "third," "fifth," etc. write uses a "true cell" and the "second," "fourth," "sixth," etc. write uses a "complement cell."

Figure 7A:
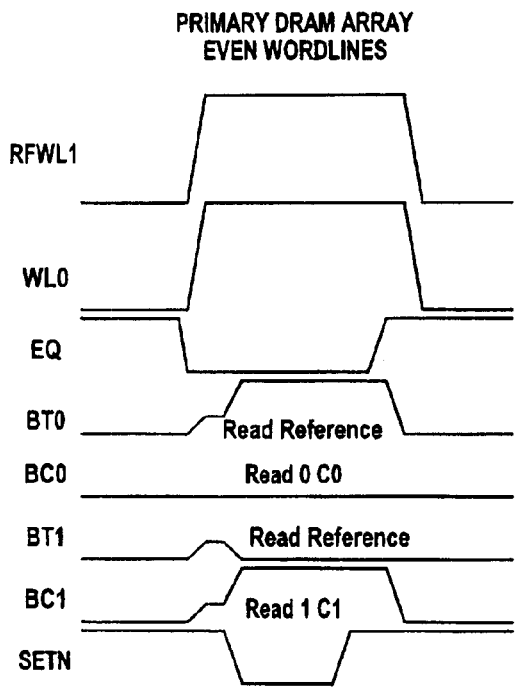
FIGS. 7A and 7B are timing diagrams of various signals in the array according to the present invention.
Figure 7B:
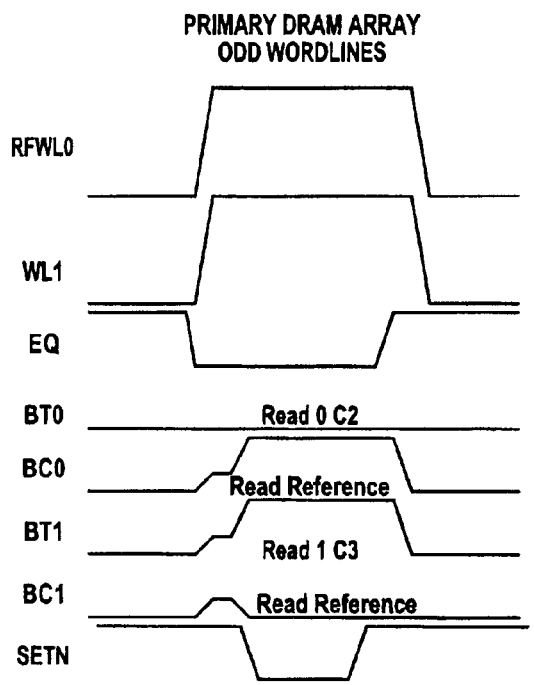

FIGS. 7A and 7B are timing diagrams of various signals in the array according to the present invention. FIG. 7A illustrates the timings for even numbered word lines in primary DRAM array 100 and FIG. 7B illustrates the timings for odd numbered word lines in primary DRAM array 100 (see FIG. 1).

Figure 8A:
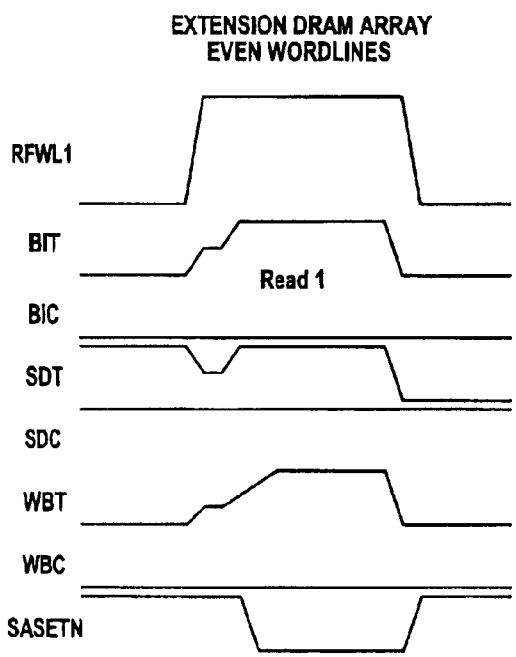
FIGS. 8A and 8B are timing diagrams of various signals in the array extension according to the present invention.
Figure 8B:
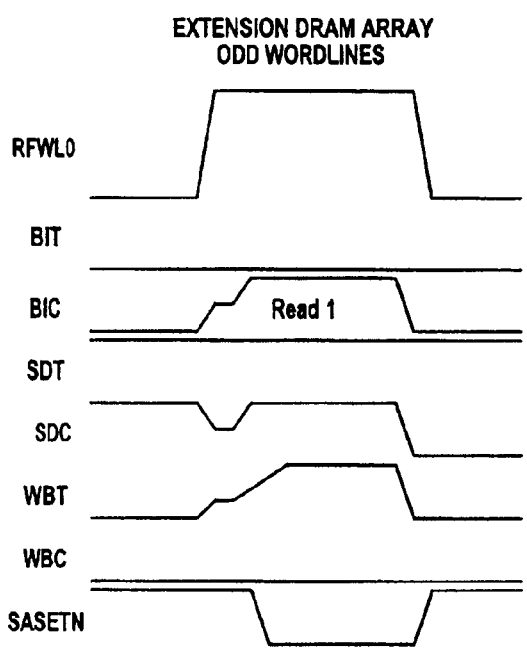

FIGS. 8A and 88 are timing diagrams of various signals in the array extension according to the present invention. FIG. 8A illustrates the timings for even numbered word lines in extension DRAM array 200 and FIG. 8B illustrates the timings for odd numbered word lines in extension DRAM array 200 (see FIG. 2). Timing diagrams 7A and 8A utilize the same time base and timing diagrams 7B and 8B utilize the same time base.

FIGS. 9A and 9B are timing diagrams of various signals in the array and array extension during page mode according to the present invention. FIG. 9A illustrates the timings for selected signals in primary DRAM array 100 (see FIG. 1) and FIG. 9B illustrates the timings for selected signals in extension DRAM array 200 (see FIG. 2). Timing diagrams 9A and 9B utilize the same time base.

Figure 10:
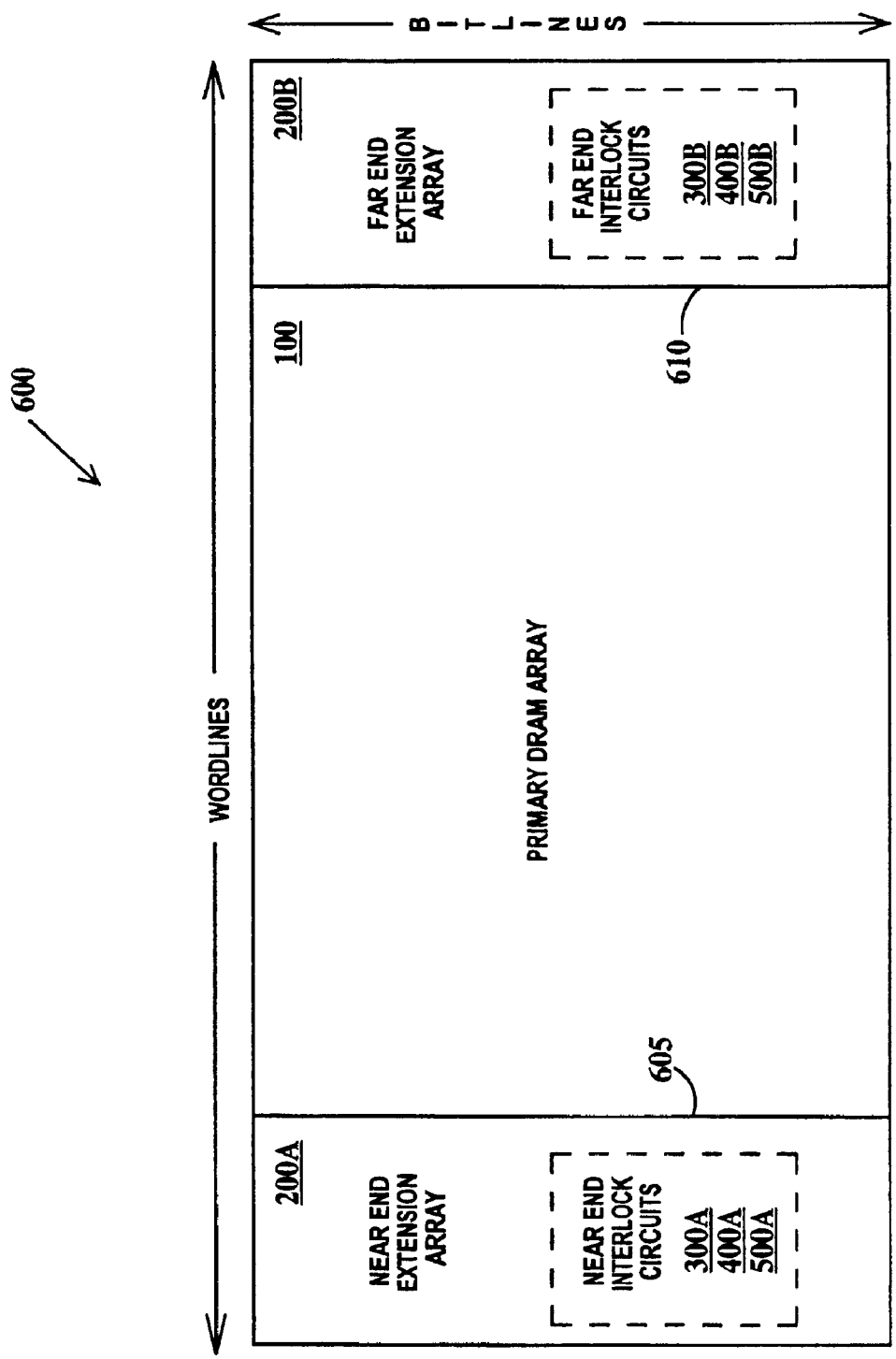
FIG. 10 is a top view block diagram of an embedded DRAM 600 according to the present invention.

FIG. 10 is a top view block diagram of embedded DRAM 600 according to the present invention. In FIG. 10, embedded DRAM 600 includes a centrally located primary DRAM array 100 and a near end extension DRAM array 200A and a far end extension DRAM array 200B. Near end extension DRAM array 200A and a far end extension DRAM array 200B are identical to extension DRAM 200 illustrated in FIG. 2 and described supra. Contained within the same space as near end extension DRAM array 200A are near end interlock circuits 300A, 400A and 500A and contained within the same space as far end extension DRAM array 200B are far end interlock circuits 300B, 400B and 500B. Near and far end interlock circuits 300A and 300B are identical to signal development interlock circuit 200 illustrated in FIG. 3 and described supra. Near and far end interlock circuits 400A and 400B are identical to a sense amplifier interlock circuit 400 illustrated in FIG. 4 and described supra. Near and far end interlock circuits 500A and 500B are identical to write back interlock circuit 500 illustrated in FIG. 5 and described supra.

Near end extension DRAM array 200A and a far end extension DRAM array 200B are located on opposite edges 605 and 610, respectively, of primary DRAM array 100, edges 605 and 610 defined by the direction of the bitlines. Interlock circuits 300A, 400A and 500A in near end extension arrays 200A may be "OR'd" together to with the corresponding interlock circuits 300B, 400B and 500B in far end extension arrays 200B to improve the reliability of the timing provided by interlock circuits. Interlock circuits 300A, 400A and 500A in near end extension arrays 200A and interlock circuits 300B, 400B and 500B in far end extension arrays 200B may be activated independently.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. An embedded DRAM comprising:
    a primary DRAM array comprising:
        a data cell coupled to a first bitline and coupled to a wordline;
        a reference cell coupled to said first bitline and coupled to a reference wordline;
        a first bitline restore circuit coupled to said first bitline and responsive to a first control signal;
        a first sense amplifier coupled to said first bitline and responsive to a second control signal; and
        a first column select device for gating writing and reading of said first bitline, said first column select device coupled to said first bitline and responsive to a third control signal; and
    an extension DRAM array comprising:
        a dummy cell coupled to a second bitline;
        a first detector cell coupled to said second bitline and coupled to said reference wordline;
        a signal development interlock circuit for monitoring the state of said first detector cell and interlocking said second control signal in order to delay the setting of said first sense amplifier until said data cell charges said first bitline;
        a second detector cell coupled to said second bitline;
        a write back interlock circuit for monitoring the state of said second detector cell and for delaying turning off said wordline until said data cell is charged;
        a second bitline restore circuit coupled to said second bitline and responsive to said first control signal;
        a second sense amplifier coupled to said second bitline and responsive to said second control signal;
        a sense amplifier interlock circuit for monitoring the state of said second bitline and for delaying said third control signal until said first sense amplifier has stabilized; and
        a second column select device for gating coupling of said second bitline to a dummy load, said second column select device coupled to said second bitline and responsive to said third control signal.

2. The embedded DRAM of claim 1, further including:
an additional extension DRAM array comprising:
an additional dummy cell coupled to a third bitline;
a third detector cell coupled to said third bitline and coupled to said reference wordline
an additional signal development interlock circuit for monitoring the state of said third detector cell and also interlocking said second control signal in order to delay the setting of said first sense amplifier until said data cell charges said first bitline;
a fourth detector cell coupled to said third bitline;
an additional write back interlock circuit for monitoring the state of said fourth detector cell and for also delaying turning off said wordline until said data cell is charged;
a third bitline restore circuit coupled to said third bitline and responsive to said first control signal;
a third sense amplifier coupled to said third bitline and responsive to said second control signal;
an additional sense amplifier interlock circuit for monitoring the state of said third bitline and for also delaying said third control signal until said first sense amplifier has stabilized; and
a third column select device for gating coupling of said third bitline to an additional dummy load, said third column select device coupled to said third bitline and responsive to said third control signal.

3. The embedded DRAM of claim 1, wherein said first and second sense amplifiers are designed to be identical and are located adjacent to one another.

4. The embedded DRAM of claim 1, wherein said extension DRAM array is located adjacent to said primary DRAM array.

5. The embedded DRAM of claim 1, wherein said reference cell, said first detector cell and said second detector cell are designed to be identical.

6. The embedded DRAM of claim 1, wherein:
said extension DRAM array contains a third detector cell, said third detector cell coupled to said second bitline; and
said write back interlock detector circuit toggles between said second detector cell and said third detector cell on alternative write cycles.

7. A circuit comprising:
a primary DRAM array comprising a data cell coupled to a first bitline and coupled to a wordline, a reference cell coupled to said first bitline and coupled to a reference wordline, a first bitline restore circuit coupled to said first bitline and responsive to a first control signal, a first sense amplifier coupled to said first bitline and responsive to a second control signal and a first column select device for gating data write and read of said first bitline, said first column select device coupled to said first bitline and responsive to a third control signal;
an extension DRAM array comprising a dummy cell coupled to a second bitline, a first detector cell coupled to said second bitline and coupled to said reference wordline, said first detector cell generating a signal development control signal, a second detector cell coupled to said second bitline, said second detector cell generating a write back control signal, a second bitline restore circuit coupled to said second bitline and responsive to said first control signal, a second sense amplifier coupled to said second bitline and responsive to said second control signal and a second column select device for gating coupling of said second bitline to a dummy load, said second column select device coupled to said second bitline and responsive to said third control signal;
a signal development interlock circuit for generating said second control signal, said signal development interlock circuit coupled to said first detector cell and receiving said signal development control signal;
a sense amplifier interlock circuit for generating said third control signal, said sense amplifier interlock circuit coupled to said first control signal and said second bitline; and
a write back interlock circuit for controlling turn off of said wordline, said write back interlock circuit coupled to said second detector cell and receiving said write back control signal.

8. The circuit of claim 7, further including:
an second extension DRAM array comprising an additional dummy cell coupled to a third bitline, a third detector cell coupled to said third bitline and coupled to said reference wordline, said third detector cell also generating said signal development control signal, a fourth detector cell coupled to said third bitline, said fourth detector cell also generating said write back control signal, a third bitline restore circuit coupled to said third bitline and responsive to said first control signal, a third sense amplifier coupled to said third bitline and responsive to said second control signal and a third column select device for gating coupling of said third bitline to an additional dummy load, said third column select device coupled to said third bitline and responsive to said third control signal;
an additional signal development interlock circuit for reinforcing said second control signal, said additional development interlock circuit coupled to said third detector cell and receiving said signal development signal;
an additional sense amplifier interlock circuit for reinforcing said third control signal, said additional sense amplifier interlock circuit coupled to said first control signal and said third bitline; and
an additional write back interlock circuit for reinforcing said controlling turn off of said wordline, said additional write back interlock circuit coupled to said fourth detector cell and receiving said write back control signal.

9. The circuit of claim 8, wherein:
said extension DRAM array contains a third detector cell, said third detector cell coupled to said second bitline and said second detector cell generating an additional write back control signal; and
said write back interlock circuit toggles between said second detector cell and said write back control signal and third detector cell and said additional write back control signal on alternative write cycles.

10. The circuit of claim 7, wherein said first and second sense amplifiers are designed to be identical and are located adjacent to one another.

11. The circuit of claim 7, wherein extension DRAM array is located adjacent to said primary DRAM array.

12. The circuit of claim 7, wherein said primary DRAM array and said extension DRAM array comprise an embedded DRAM.

13. The circuit of claim 7, wherein said reference cell, said first detector cell and said second detector cell are designed to be identical.

14. A method for self timing a DRAM circuit comprising:

providing a primary DRAM array, said primary DRAM comprising a data cell coupled to a first bitline and coupled to a wordline, a reference cell coupled to said first bitline and coupled to a reference wordline, a first bitline restore circuit coupled to said first bitline and responsive to a first control signal, a first sense amplifier coupled to said first bitline and responsive to a second control signal and a first column select device coupled to said first bitline and responsive to a third control signal, said first column select device gating data write and read of said first bitline;

providing an extension DRAM array, said extension array comprising a dummy cell coupled to a second bitline, a first detector cell coupled to said second bitline and coupled to said reference wordline, said first detector cell generating a signal development control signal, a second detector cell coupled to said second bitline, said second detector cell generating a write back control signal, a second bitline restore circuit coupled to said second bitline and responsive to said first control signal, a second sense amplifier coupled to said second bitline and responsive to said second control signal and a second column select device coupled to said second bitline and responsive to said third control signal, said second column select device gating coupling of said second bitline to a dummy load;

providing a signal development interlock circuit, said signal development interlock circuit coupled to said first detector cell and receiving said signal development control signal and generating said second control signal;

providing a sense amplifier interlock circuit, said dense amplifier interlock circuit coupled to said first control signal and said second bitline and generating said third control signal; and providing a write back interlock circuit, said write back interlock circuit coupled to said second detector cell and receiving said write back control signal and controlling turn off of said wordline.

15. The method of claim 14, further including:

providing an additional extension DRAM array, said additional extension DRAM array comprising a dummy cell coupled to a third bitline, a third detector cell coupled to said third bitline and coupled to said reference wordline, said third detector cell generating an additional signal development control signal, a fourth detector cell coupled to said third bitline, said fourth detector cell generating an additional write back control signal, a third bitline restore circuit coupled to said third bitline and responsive to said first control signal, a third sense amplifier coupled to said third bitline and responsive to said second control signal and a third column select device coupled to said third bitline and responsive to said third control signal, said third column select device gating coupling of said third bitline to an additional dummy load;

providing an additional signal development interlock circuit, said additional signal development interlock circuit coupled to said third detector cell and receiving said additional signal development control signal and also generating said second control signal;

providing an additional sense amplifier interlock circuit, said sense amplifier interlock circuit coupled to said first control signal and said third bitline and also generating said third control signal; and providing a write back interlock circuit, said write back interlock circuit coupled to said fourth detector cell and receiving said additional write back control signal and also controlling turn off of said wordline.

16. The method of claim 14, wherein said first and second sense amplifiers are designed to be identical and are located adjacent to one another.

17. The method of claim 14, wherein said extension DRAM array is located adjacent to said primary DRAM array.

18. The method of claim 14, wherein said primary DRAM array and said extension DRAM array comprise an embedded DRAM.

19. The method of claim 14, wherein said reference cell, said first detector cell and said second detector cell are designed to be identical.

20. The method of claim 14, wherein:

said extension DRAM array contains a third detector cell, said third detector cell coupled to said second bitline and said second detector cell generating an additional write back control signal; and said write back interlock circuit toggles between said second detector cell and said write back control signal and third detector cell and said additional write back control signal on alternative write cycles.

* * * * *